United States Patent [19]

Gröeger et al.

[11] 4,037,218

[45] July 19, 1977

[54] READ ONLY MEMORY MODULE

[75] Inventors: Ingo Gröeger; Jüergen Scharbert, both of Munich, Germany

[73] Assignee: Siemens Aktiengesellschaft, Berlin & Munich, Germany

[21] Appl. No.: 651,909

[22] Filed: Jan. 23, 1976

[30] Foreign Application Priority Data

Feb. 7, 1975 Germany .............................. 2505245

[51] Int. Cl.² ............................................. G11C 13/00
[52] U.S. Cl. ........................... 340/173 R; 340/173 SP
[58] Field of Search ..................................... 340/173 R

[56] References Cited

U.S. PATENT DOCUMENTS 3,739,355  6/1973  Radliffe ............................ 340/173 R Primary Examiner—Terrell W. Fears
Attorney, Agent, or Firm—Hill, Gross, Simpson, Van Santen, Steadman, Chiara & Simpson

[57] ABSTRACT

In order to achieve defined potentials on unselected column lines, in a read only memory module in which storage elements are arranged between intersecting row lines and column lines, each column line is connected to a fixed auxiliary voltage by way of an auxiliary resistor and the value of the auxiliary voltage is more negative than the voltage on the row line selected during a read operation and the value of the auxiliary resistors is sufficiently large that the current on a selected column line flowing from the auxiliary voltage source by way of the auxiliary resistor into the selected column line is small vis-a-vis the read current flowing in the column line.

2 Claims, 5 Drawing Figures

READ ONLY MEMORY MODULE

BACKGROUND OF THE INVENTION

1. Field of the Invention

This invention relates to a read only memory module in which the storage elements are arranged between column lines and row lines, and more particularly to providing an equal access time in such a module for all storage elements thereof.

2. Description of the Prior Art

In programmable read only memories, for example, storage elements are arranged in a matrix form at the intersections of row lines and column lines. The storage elements may consist of a circuit element and an interruptable resistor. The circuit element may be a transistor or a diode, as an example of construction. The interruptable resistor, hereinafter called a memory resistor, may be manufactured from NiCr, for example. If information is to be written into the programmable read only memory, the interruptable resistors are to be interrupted corresponding to the information which is to be stored. For example, a binary "1" corresponds to an interrupted resistor, whereas a binary "0" corresponds to an uninterrupted resistor. The interruption of the resistors takes place by sending a correspondingly large current therethrough. This made possible by applying a correspondingly large voltage to the storage elements and effecting a through connection of the circuit elements.

The circuit elements, for example, may consist of a transistor, hereinafter called a memory transistor, and a memory resistor connected in the emitter circuit of the memory transistor. The base of the memory transistor may be connected to a row line, the collector may be connected to an operating voltage, and the memory resistor may connect the emitter to a column line. If the stored information is to be read out of a specific storage element, the assigned column line and the assigned row line must be activated.

According to whether the storage resistor is not interrupted, a current or no current flows over the collector-emitter path. This current continues to flow on the assigned column line to a constant current source. In addition, a read transistor is connected to the column line, which is in turn connected to a read amplifier. If the storage resistor is not interrupted, the current of the constant current source flows over the storage resistor and the storage transistor. However, if the storage resistor is interrupted, the constant current of the constant current source flows over the read transistor. According to whether the constant current flows over the storage resistor or over the read transistor, the read transistor emits a corresponding voltage, which is amplified by the read amplifier.

In storage matrices of this type, however, the access time is also particularly dependent upon the potential on the column lines. While defined potentials are applied to a selected column line, the unselected column lines accept the potential of the selected row lines for a long period of time, i.e. the unselected column lines are slowly charged to the potential of the selected row line via the interconnecting storage elements. This causes the potential to have different values prior to access, depending on how often a column line is used during the reading operation. Because of this, however, the access times to the information in the storage matrix will be different.

SUMMARY OF THE INVENTION

The primary object of the present invention is, therefore, to provide a read only memory in which the access time to the information in a storage matrix is nearly equal for all storage elements.

In a read only memory module of the type generally discussed above, this object is achieved in that each column line is connected to a fixed auxiliary voltage by way of an auxiliary resistor for the purpose of attaining defined potentials on the unselected column lines. The value of the auxiliary voltage is more negative than the voltage on the row line selected during a reading operation, and the value of each auxiliary resistor is so great that the current on the selected column line flowing from the auxiliary voltage source into the selected column line, by way of the auxiliary resistors, is small vis-a-vis the read current flowing in the column line.

BRIEF DESCRIPTION OF THE DRAWINGS

Other objects, features and advantages of the invention, its organization, construction and operation will be best understood from the following detailed description taken in conjunction with the accompanying drawings, on which.

DESCRIPTION OF THE PREFERRED EMBODIMENT

Figure 1:
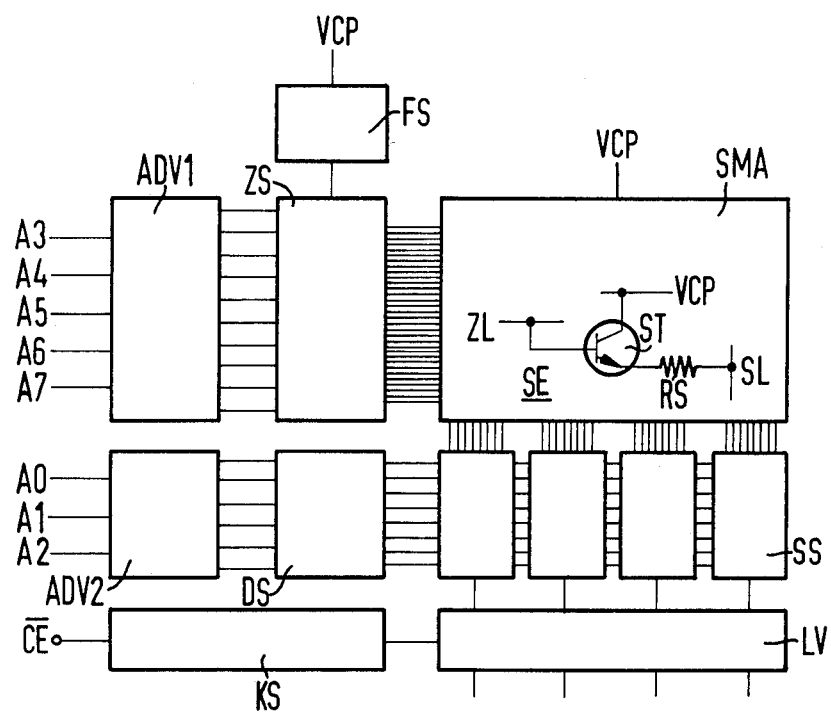
FIG. 1 is a block diagram illustration of a programmable read only memory.

Referring to FIG. 1, a storage matrix SMA is illustrated as comprising storage elements SE arranged between row lines, designated ZL, and column lines, designated SL. The storage elements are arranged at the intersections of the row lines ZL and the column lines SL. In the exemplary embodiment illustrated in FIG. 1, the storage elements comprises a memory transistor ST and a memory resistor RS connected in the emitter circuit of the memory transistor ST. The memory resistor RS may be, for example, a NiCr resistance, for example.

Address signals A0 through A7 are fed to the read only memory for the purpose of selecting row lines and/or column lines. The address signals for the row lines are amplified in an address amplifier ADV1, and the amplified address signals are then fed to a plurality of row switches ZS. In the latter, the address signals are also decoded. Correspondingly, the address signals for the column lines are amplified in an address amplifier ADV2, and then fed to a decoder circuit DS. Four column circuit groups SS are connected to the decoder circuit DS. The storage matrix, in particular, is constructed in such a way that a specific number of column lines are integrated into a bank of column lines. One group of column switches serves each bank of column lines. Read amplifiers LV are also connected to the column lines, whereby a read amplifier is assigned to each bank of column lines. The amplified read signals appear at the output of the read amplifiers LV. An additional signal $\overline{CE}$ is supplied to the storage module, by means of which the module is selected. The signal $\overline{CE}$ is supplied to the read amplifiers by way of a preparatory circuit KS. Finally, a circuit arrangement FS is provided for storing information and has an operating voltage source VCP connected thereto.

Figure 2:
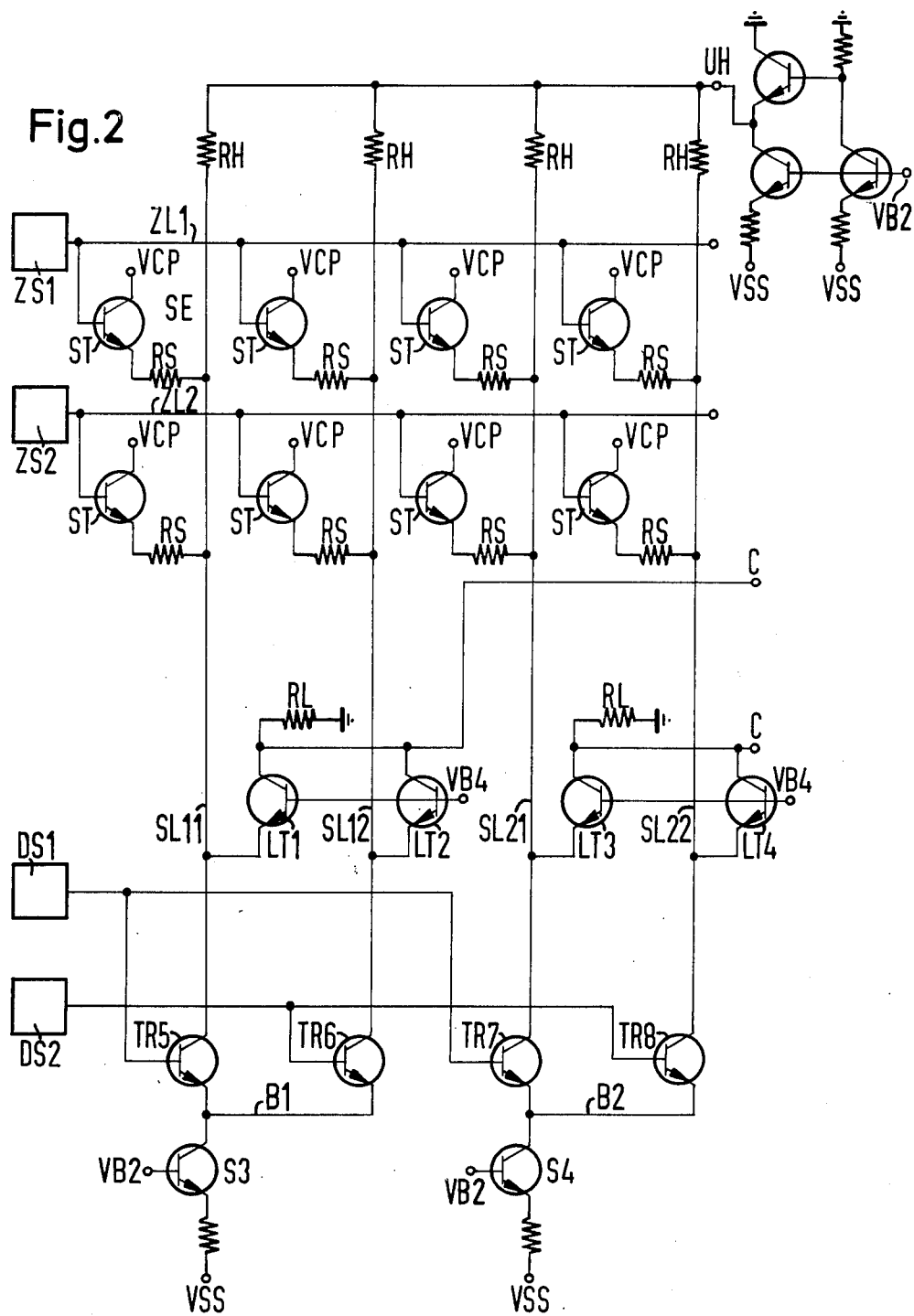
FIG. 2 is a schematic circuit diagram of a read only memory module, in the form of a storage matrix, and particularly showing a circuit for practicing the present invention.

Referring to FIG. 2, a more detailed showing of an embodiment of a storage matrix is provided with the circuits directly connected to the row lines and column lines. The storage matrix is realized as a programmable ECL storage module, and, in the exemplary embodiment illustrated herein, comprises two row lines ZL1 and ZL2 and two banks of two column lines each, SL11, SL12 and SL21, SL22. The storage elements, which comprise a memory transistor ST and a storage resistor RS, are each arranged between row lines and column lines. The base of a storage transistor ST is connected to a row line ZL. The interruptable memory resistor RS is connected between the emitter of the memory transistor ST and the appertaining column line SL. The collector of the transistor ST is connected to the operating voltage source VCP.

The row lines ZL are connected to a row switch ZS, respectively. This means that the row switch ZS1 is connected to the row line ZL1, and the row switch ZS2 is connected to the row line ZL2.

The one ends of the column lines SL are connected to a constant current source S3, S4 by way of respective column switch transistors TR5, TR6, TR7 and TR8. The constant current sources S3 and S4 are necessary during the reading of the storage matrix. The column switches TR5, TR6, and TR7, TR8, respectively, are additionally connected to the decoder circuits DS1 and DS2. Two column lines each are integrated into a bank B via the column switch emitters; for example, the column lines SL11 and SL12 are integrated into a bank B1, and the column lines SL21 and SL22 are integrated into a bank B2. The emitters of the column switch transistors of each bank are connected to one another, and, for the bank B1, are connected to the current source S3, and, for the bank B2, are connected to the current source S4.

The read transistors LT are also arranged on the column lines SL. The read transistors LT accept the read signal from the column lines, and supply the same to the read amplifiers at the point C. The read transistor LT1 is connected to the column line SL11, the read transistor LT2 is connected to the column line SL12, the read transistor LT3 is connected to the column line SL21, and the read transistor LT4 is connected to the column line SL22. A load resistor RL is, in each case, inserted in the collector path of the read transistors LT which are assigned to a bank of column lines. The base terminals of the read transistors LT are connected to a reference voltage VB4. The potential VSS is an operating voltage.

The column lines SL, are moreover, connected to an auxiliary voltage UH by way of respective auxiliary resistors RH. With the help of this structure, it is possible for a defined potential to be applied to the column lines SL, even when the latter are not selected. The auxiliary voltage UH is therefore provided with a value which is more negative than the voltage on the row line selected during a reading operation. The value of the auxiliary resistors RH is selected such that the current on the selected column line flowing from the auxiliary voltage UH into the selected column line via the auxiliary resistor RH is small vis-a-vis the read current flowing in a selected column line. If, for example, the read current is designated by IO, the auxiliary current IH, for example, is selected to be so small, which means that the relationship IH < IO/10 is effective. Since, due to the insertion of the auxiliary resistors RH, and their connection to an auxiliary voltage UH, the unselected column lines are also connected to a defined potential, and the voltage deviations on the column lines during the reading of information remain nearly equal. The unselected column lines thus can no longer shift toward the potential of the selected row lines.

In an example of reading information from the read only memory, it is assumed that the information is read from a storage element SE, the particular element involved being the second element from the left in the upper row in FIG. 2 which is interconnected between the row line ZL1 ad the column line S12. The row line ZL1 is activated by the row switch ZS1. This causes the transistor ST of the storage element to be brought into the conductive state. Simultaneously, the column switch transistor TR6 is activated by the decoder circuit DS2 and brought into the conductive state. Now the constant current of the constant current source S3 can flow in the column line SL12.

Let it be assumed that the memory resistor RS is not interrupted. Then, the constant current of, for example, 2 mA flows from the voltage source VCP via the memory transistor ST, the storage resistor RS, the column line S12 and the transistor TR6 to the constant current source S3. Simultaneously, the auxiliary current from the auxiliary current source UH flows into the column line S12 via the auxiliary resistor RH. However, the auxiliary current is so small with respect to the read current that it can be ignored. The potential being applied to the column line S12 is such that the read transistor LT2 remains blocked.

If the storage resistor RS is interrupted, the read current cannot flow over the storage element. Rather, the read current is now assumed by the read transistor LT2. Now the read current flows over the read resistor RL, the read transistor LT2 and the column switch transistor TR6 to the constant current source S3. Now a considerable voltage drop results over the load resistor RL, so that the collector voltage of the read transistor LT2 becomes lower. In the present case, also, the auxiliary current which flows from the auxiliary voltage UH by way of the auxiliary resistor RH into the column line SL12, is negligible with respect to the read current flowing through the read transistor LT2.

Thus, potentials are formed on the selected column line which are defined, since the read current flows either over the storage element or over the read transistor LT.

By inserting the auxiliary resistors RH and the auxiliary voltage UH, however, the potential on unselected column lines is also defined; it corresponds approximately to the auxiliary voltage UH. For, in the case of an interrupted memory resistor RS, either a very small current flows over the read transistor LT, if the reference voltage VB4 is more positive than the auxiliary voltage UH, or the column line SL is directly charged by way of the auxiliary resistor RH. In the case of an uniterrupted memory resistor RS, on the contrary, a very small current flows from the selected row line by way of a storage element and by way of an auxiliary resistor RH to the auxiliry voltage UH. Therefore, the voltage deviation on a column line, which results during the reading out of a storage element, is no longer dependent upon the stored information and upon the time in which no access is made to a column line. Then, however, also the access time to the information in the storage matrix is nearly equal at all places.

The construction of row switches ZS and the decoder circuits DS have no bearing on the present invention. However, these circuits are illustrated in FIG. 3 for the purpose of clarification.

Figure 3:
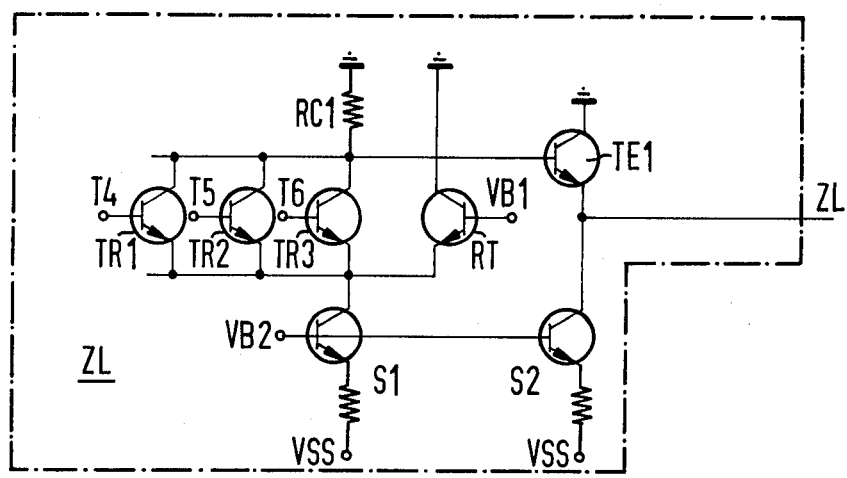
FIG. 3 is a schematic circuit diagram of a row switch which may be employed in the apparatus illustrated in FIG. 2.

FIG. 3 illustrates the construction of a row switch ZL which comprises a differential amplifier. The differential amplifier is constructed of parallel connected control transistors TR1, TR2, TR3, a reference transistor RT, and a collector resistor RC1. Address signals T4, T5 and T6 are supplied to the control transistors of the differential amplifier. An emitter follower TE1 is connected to the collector of the control transistors. Constant current sources S1 and S2 supply the differential amplifier and the emitter follower, respectively. A row line ZL is selected when all control transistors TR1, TR2 and TR3 are blocked. The voltage which then prevails at the collectors of the control transistors is transferred to a row line ZL by way of the emitter follower TE1.

The row line ZL is considered unselected if at least one of the control transistors TR1, TR2, TR3 is in the conductive state. A current then flows through the collector resistor RC1, which causes a voltage drop. The collector voltage, which is then lower, is again transferred to the row line ZL by way of the emitter follower TE1. The memory transistors are blocked due to this lower voltage on the row line ZL.

The constant current source S are all constructed in the same manner, which construction is well known in the art. The voltage VB2 is a reference voltage.

The decoder circuits DS can basically be constructed corresponding to the row switch (FIG. 3) whereby, however, the output potentials of the decoder circuits differ from the output potentials of the row switch.

Figure 4:
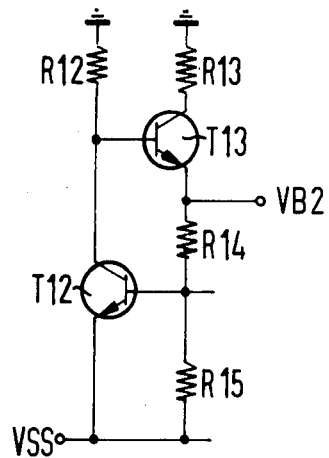
FIG. 4 is a schematic circuit diagram of a circuit for producing a reference voltage.

FIG. 4 illustrates a circuit arrangement by means of which the reference voltage VB2 can be produced. This circuit comprises a pair of transistors T12 and T13 and a plurality of resistors R12, R13, R14 and R15. This type of circuit is also well known in the art and a detailed discussion thereof is not deemed necessary.

Figure 5:
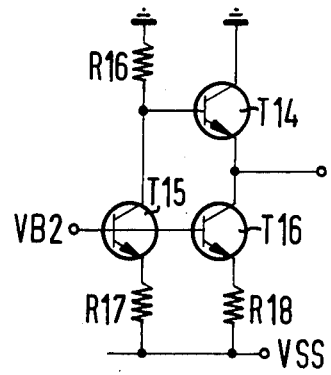
FIG. 5 is a schematic circuit diagram of another circuit for producing additional reference voltages.

The same holds true for FIG. 5 which illustrates a circuit for producing other reference voltages, such as the voltages VB1 and VB4. This circuit may be constructed from a plurality of transistors T14, T15 and T16, and a plurality of resistors R16, R17 and R18. The reference voltages emitted from this circuit can, of course, be of different size, depending upon the dimensioning of the component elements employed.

This invention has been described on the basis of an ECL storage matrix. However, it can also be employed in other read only memories.

In particular construction the following values were utilized and/or obtained.

UH $-1.5$
VB1 $-1.0$
VB2 $-3.7$
VB4 $-1.3$

The potential on a column line during an interruption of a resistor RS was approximately $-2.5$ V. the reading potential on a column was approximately $-1.3$ V. The reading current was approximately 2 mA, and the current for interrupting a resistor RS was 20–30 mA.

Although we have described our invention by reference to a particular illustrative embodiment thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A read only memory module comprising a plurality of row lines, a plurality of column lines intersecting said row lines, a plurality of storage elements connecting the intersections of respective row lines and column lines, said row lines and column lines having potentials selectively applied thereto for reading information from said storage elements, a plurality of auxiliary resistors each connected to a respective column line, and an auxiliary voltage source connected to each of said auxiliary resistors, the value of the auxiliary voltage of said auxiliary voltage source being more negative than the voltage on a selected row line during a reading operation, and the value of each auxiliary resistor being sufficiently large that the current on a selected column line flowing via the respective auxiliary resistor and the selected column line is small with respect to the read current flowing in the column line.

2. A read only memory according to claim 1, comprising, for each column line, a read transistor having a collector-emitter circuit connected to the respective column line and a base connected to a reference potential which is more positive than said auxiliary voltage.

* * * * *